(12) United States Patent
Biber et al.

(10) Patent No.: US 9,645,208 B2
(45) Date of Patent: May 9, 2017

(54) MATERIAL FOR USE IN A MAGNETIC RESONANCE SYSTEM, METHOD FOR PRODUCING THE MATERIAL AND MAGNETIC RESONANCE SYSTEM

(71) Applicants: Stephan Biber, Erlangen (DE); Yvonne Candidus, Tuchenbach (DE); Hubertus Fischer, Bamberg (DE); Robert Greiner, Baiersdorf (DE); Thomas Kundner, Buckenhof (DE)

(72) Inventors: Stephan Biber, Erlangen (DE); Yvonne Candidus, Tuchenbach (DE); Hubertus Fischer, Bamberg (DE); Robert Greiner, Baiersdorf (DE); Thomas Kundner, Buckenhof (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 1063 days.

(21) Appl. No.: 13/848,132

(22) Filed: Mar. 21, 2013

(65) Prior Publication Data

US 2013/0249557 A1    Sep. 26, 2013

(30) Foreign Application Priority Data

Mar. 22, 2012  (DE) .................. 10 2012 204 570

(51) Int. Cl.
*G01R 33/38* (2006.01)
*H01F 1/00* (2006.01)
(Continued)

(52) U.S. Cl.
CPC .......... *G01R 33/38* (2013.01); *G01R 33/565* (2013.01); *G01R 33/56536* (2013.01);
(Continued)

(58) Field of Classification Search
CPC  G01R 33/38; G01R 33/565; G01R 33/56356; G01R 33/34007; H01F 1/01; H01F 1/0063
See application file for complete search history.

(56) References Cited

U.S. PATENT DOCUMENTS 5,323,780 A  *  6/1994  Briggs ............... G01R 33/5601
                                                    424/9.32
5,396,136 A       3/1995  Pelrine
(Continued)

FOREIGN PATENT DOCUMENTS

CN       1677125 A       10/2005
DE     19711610 A1       10/1997
(Continued)

OTHER PUBLICATIONS

Garc C. Lee, et.al: "Pyrolytic Graphite Foam: A Passive Magnetic Susceptibility Matching Material" in Journal of Magnetic Resonance Imaging, 2010, vol. 32, pp. 684-691; 2010.
(Continued)

*Primary Examiner* — G. M. Hyder

(57) ABSTRACT

A material for use in a magnetic resonance system includes a carrier material and a doping material. The carrier material and the doping material are admixed in a specific proportion. A volume of the material smaller than 1 mm² contains a substantially homogeneous intermixing of the carrier material and the doping material.

19 Claims, 3 Drawing Sheets

(51) Int. Cl.
*H01F 1/01* (2006.01)
*H01F 1/42* (2006.01)
*G01R 33/565* (2006.01)
*G01R 33/34* (2006.01)

(52) U.S. Cl.
CPC ............ *H01F 1/0063* (2013.01); *H01F 1/01* (2013.01); *H01F 1/42* (2013.01); *G01R 33/34007* (2013.01)

(56) References Cited

U.S. PATENT DOCUMENTS

| | | | |
|---|---|---|---|
| 5,498,372 A * | 3/1996 | Hedges | C08K 9/08 106/472 |
| 5,550,383 A * | 8/1996 | Haskell | C08K 3/08 250/515.1 |
| 5,705,014 A * | 1/1998 | Schenck | G01R 33/28 156/242 |
| 5,987,672 A | 11/1999 | Oosterwaal | |
| 6,673,258 B2 | 1/2004 | Purizhansky | |
| 7,171,254 B2 | 1/2007 | Vavrek | |
| 7,604,875 B2 | 10/2009 | Wagner | |
| 2005/0181155 A1 * | 8/2005 | Share | B29C 49/22 428/35.7 |
| 2007/0279054 A1 | 12/2007 | Candidus | |
| 2009/0152109 A1 * | 6/2009 | Whitehead | G01N 27/307 204/400 |
| 2009/0295389 A1 | 12/2009 | Pruessmann | |
| 2013/0249556 A1 * | 9/2013 | Biber | H01F 1/0018 324/318 |

FOREIGN PATENT DOCUMENTS

| | | |
|---|---|---|
| DE | 102004015859 | 10/2005 |
| DE | 102006025940 | 12/2007 |
| DE | 102008060708 A1 | 6/2010 |
| DE | 102011006569 | 10/2012 |
| JP | H10290839 A | 11/1998 |
| JP | 2008295884 A | 12/2008 |
| JP | 2009028506 A | 2/2009 |
| WO | WO 2007022499 A2 | 2/2007 |

OTHER PUBLICATIONS

Praxis Dr. B. Sander: MR-Grundlagen www.mrx.de/mrpraxis/mrgrund.html; 2011; Dec. 2, 2011.
Marjanska, M., u.a.: Multinuclear NMR Investigation of Probe Construction Materials at 9.4 T.; Marjanska, M., u.a.: Multinuclear NMR Investigation of Probe Construction Materials at 9.4 T. In: Magn Reson Med, 59, 2008, 936-938.
http://de.wikipedia.org/wiki/Acrylnitril-Butadien-Styrol, 2015, Feb. 13, 2015.
IBEH,C. C.: "Thermoplastic Materials" CRC Press, 2011 (3 pages), 2011.

* cited by examiner

MATERIAL FOR USE IN A MAGNETIC RESONANCE SYSTEM, METHOD FOR PRODUCING THE MATERIAL AND MAGNETIC RESONANCE SYSTEM

CROSS REFERENCE TO RELATED APPLICATIONS

This application claims priority of German Patent Office application No. 102012204570.8 DE filed Mar. 22, 2012. All of the applications are incorporated by reference herein in their entirety.

FIELD OF INVENTION

Embodiments herein relate to a material for use in a magnetic resonance system, a method for producing the material and a magnetic resonance system comprising components made of the material. In particular, the embodiments relate to a material with reduced visibility in magnetic resonance imaging.

BACKGROUND OF INVENTION

Magnetic resonance (MR) imaging is an imaging method, which is used in many fields of medicine for examination and diagnosis. It is based on the physical effect of nuclear magnetic resonance. To this end, to acquire MR signals, a basic-field magnet applies a basic magnetic field within a region to be examined which aligns magnetic moments of nuclei, for example hydrogen nuclei H-1 or nitrogen nuclei N-14.

The irradiation of radio-frequency (RF) pulses enables the nuclear spins to be deflected or excited out of the aligned position parallel to the basic magnetic field, i.e. the rest position or another state. During relaxation in the rest position, a decay signal is generated, which can be detected as an MR signal by means of one or more RF receive coils. For example, selective dephasing and rephasing of the nuclear spins by suitably switched gradient fields can generate an MR signal. An effect of this kind is used in so-called gradient echo MR imaging sequences.

The application of a slice selection gradient during the irradiation of the radio-frequency pulses only excites nuclear spins in one slice of the object to be examined, in which the resonance condition is fulfilled due to the local magnetic field strength. Further spatial encoding can be performed by applying at least one phase-encoding gradient and one frequency-encoding gradient during the readout. This enables spatially resolved MR signals to be obtained from a number of slices of an examination subject. In this way, suitable imaging methods enable the provision of a 3-dimensional (3D) image of a specific area of the examination subject for purposes of diagnosis. Here, a typical spatial resolution of MR imaging can be, for example, 1 mm in all three spatial directions. A spatially extended imaging point of this kind is called a voxel.

For MR imaging, a patient is generally placed on a couch or a table in the interior of the main-field magnet. In addition, local RF coils are used to improve MR imaging, said coils being placed in the immediate vicinity of the patient. As a result, the imaging area contains not only the patient, but also other parts, such as, for example, the couch and the coils, which are made of a wide variety of materials. However, these materials can also be imaged because they comprise nuclei which are also used for MR imaging.

Imaging properties of materials located within the examination area used for MR imaging can give rise to artifacts in the MR images. Artifacts of this kind can result in an incorrect diagnosis or render the image unusable for purposes of diagnosis. Only relatively few materials are known which in empirical tests have reduced visibility in MR imaging. Since, in addition to reduced visibility in MR imaging, there are also further criteria which determine suitability for use in an MR system, for example no or low electrical conductivity and no or low magnetic susceptibility, the number of usable materials is limited.

Since significantly less-expensive plastic materials, for example, cannot be used, this may result in increased costs for the production of components to use in the MR system. In addition, it not possible to use, for example, soft and flexible plastic materials, such as those known from various aspects of daily life, since, as solid materials, these do not have reduced visibility in MR imaging. This can result in reduced comfort and restricted design freedom when using or producing components for use in an MR system. In addition, it is not possible to use materials that are particularly easy to produce or particularly robust or stable materials. This can result in reduced reliability or a reduced lifetime of the components to be used in the MR system.

For example, techniques are known from U.S. Pat. No. 7,604,875 B2 which enable the magnetic susceptibility of carrier materials to be matched to fixed predetermined values by the addition of paramagnetic and/or diamagnetic materials. However, the techniques disclosed therein relate to the reduction of a susceptibility mismatch, as a result of which the static magnetic field varies on a length scale of several centimeters and deviates from the desired value of the basic magnetic field. This can result, for example, in shifts or spatial domain distortions in MR images or have a negative influence on the quality of spectral fat saturation techniques. However, the visibility of the materials in MR imaging is not affected.

SUMMARY OF INVENTION

Therefore, there is a requirement to provide techniques which enable the provision of materials in components of an MR system without the aforementioned drawbacks and with reduced MR visibility. In particular, there is a requirement to provide techniques, which enable the provision of a wide variety of carrier materials with reduced MR visibility.

This object is achieved by the features of the independent claims. The dependent claims describe example embodiments.

This object is fulfilled by the independent claims. The dependent claims define embodiments.

One aspect relates to a material for use in a magnetic resonance (MR) system. The material comprises a carrier material and a magnetic doping material, which is admixed in a specific proportion, wherein a volume of the material, which is smaller than 1 $mm^3$, contains a substantially homogeneous intermixing of the carrier material and the doping material.

For example, the magnetic doping material can be diamagnetic, paramagnetic or ferromagnetic. The doping material can have a magnetic susceptibility different from the magnetic susceptibility of the carrier material. For example, namely the carrier material can be non-magnetic, i.e. it has no susceptibility or only a very low magnetic susceptibility. However, it is also possible for the carrier material to be magnetic.

A substantially homogeneous intermixing can mean that, for example, any arrangement of a corresponding (test) volume with a size smaller than 1 mm$^3$, always contains the specific proportion of doping material. During the admixing of the doping material, inhomogeneities and local or microscopic deviations in the concentration may occur. This happens because there may be local regions or clusters where the doping material is present in a higher concentration than the mean value or where the carrier material is present in a higher concentration than the mean value. However, the admixing can be fine or uniform enough that inhomogeneities of this kind are not present, when averaged over the entire volume. In other words, on a microscopic length scale or a length scale smaller than 1 mm, a concentration gradient of the doping material can take on values different from zero—while concentration gradient values determined or averaged over lengths of 1 mm or longer can take on values equal or close to zero.

The effect of the admixing of the magnetic doping material with a magnetic susceptibility $\chi \neq 0$ is that, when the material is introduced into the basic magnetic field of the MR system within the material, the magnetic field deviates locally from the basic magnet field strength. This happens, for example, due to the demagnetization effect of the magnetic doping material, which intensifies or attenuates an external magnetic field. The corresponding physical phenomena of the static magnetic fields are known to the person skilled in the art and therefore need not be discussed in any further detail in this context.

Therefore, the locally varying susceptibility results in the generation of microscopic inhomogeneities of the magnetic field. In particular, the magnetic field varies on a characteristic length, which relates to the fineness of the intermixing and the (microscopic) geometry of the doping materials; that is, for example, with a characteristic length of less than 1 mm which results from the size of the volume. A homogeneous intermixing of this kind on a length scale of less than 1 mm can cause the material to have a reduced visibility in MR imaging, since the spins dephase more rapidly, i.e. shorter T2* relaxation times are achieved. For, example, namely the spatial resolution, i.e. the voxel size, of typical MR systems can also have an order of magnitude of approximately 1 mm. This means that, on the acquisition of MR signals, averaging or integration is performed over a corresponding imaging volume of for example 1 mm$^3$. If the susceptibility, and hence the local magnetic field varies within this volume, the rate at which the nuclear spins contributing to the signal dephase can differ locally. For example, when using a gradient-echo sequence, this can result in different echo times. There can be a drop in signal intensity. This can reduce the MR visibility.

For example, the material can then have a T2* relaxation time of nuclear spins in the volume which is lower than the corresponding T2* relaxation time of the carrier material by a factor of 2, for example by a factor of 4.

Here, material designates the material comprising the carrier and doping material. The T2* relaxation time is known to the person skilled in the art with respect to magnetic field inhomogeneities and relates to the dephasing of the nuclear spins transverse to the rest position (spin-spin relaxation). The T2* relaxation time can, for example, designate the time after a single 90° RF pulse after which the transversal magnetization has fallen back to 37% of its original value. For example, with gradient-echo MR imaging sequences, the T2* time can be definitive for the signal strength or a signal-to-noise ratio, so-called T2*-weighted imaging.

In this connection, the local variation in susceptibility or visibility in MR imaging due to the admixed doping materials can, for example, characteristically depend on the particle size and the particle shape of the doping material. A particle size of the doping material can be smaller than 200 µm, in particular smaller than 10 µm. In particular, a particle size can, for example, be in the range of approximately 100 µm. The term particle size can, for example, designate a mean particle size. The doping material can in particular have a particle size distribution, which can, for example, be described by a Gaussian curve. Corresponding scenarios are known to the person skilled in the art. Small particle sizes can, for example, also have advantages with respect to further properties of the material, for example robustness, conductivity, brittleness, etc.

In this connection, it is possible for the doping material to comprise magnetic nanoparticles, wherein a particle size of the doping material is smaller than approximately 1 µm, in particular smaller than approximately 100 nm. For example, magnetic nanoparticles which are ferromagnetic are known. Typically, magnetic nanoparticles can have a particularly small particle size, for example in the range of 20-50 nm. In such a case, it can be possible also to achieve a particularly homogeneous intermixing in volumes, which are much smaller than 1 mm$^3$, for example in a volume, which is 1 µm$^3$ in size.

Ferromagnetic nanoparticles can have a particularly high magnetic susceptibility and in this way cause a particularly strong variation of the local magnetic field. In this way, the difference in the local dephasing of the nuclear spins can be particularly high and visibility in MR imaging be particularly strongly reduced. In other words, the use of ferromagnetic nanoparticles can result in a particularly short T2* relaxation time of the carrier material.

The proportion can, for example, be in the range of 0.1%-80%, in particular in the range of 1%-20%, particularly in particular in the range of 9%-11%. The percentages can, for example, designate weight percents or volume percents.

In particular, the proportion can correlate directly with the macroscopic magnetic susceptibility of the material, i.e. the susceptibility, which is averaged for a large piece of the material; for example, a large proportion of the doping material can cause the macroscopic magnetic susceptibility of the material to take on a greater absolute value. Therefore, it may be desirable, on the one hand, to mix a large proportion of doping material into the carrier material. On the other hand, it can be desirable to retain, for example, electrical and mechanical properties of the material, which would be impeded if the proportion of admixed doping material were too high. For example, it can be desirable to obtain a particularly solid material but this becomes brittle if the proportions of admixed doping material are too high.

In this connection, the carrier material can, for example, be acrylonitrile butadiene styrene (ABS) plastic. Plastics of this kind are also known as Terluran plastics. In an example method of execution, the carrier material can, for example, be ABS GP22.

Generally, the carrier material can be selected from the group comprising the following elements: thermoplastics, thermoplastic elastomers, elastomers, thermosets, foams. Materials of this kind have desirable properties with respect to strength, elasticity, heat resistance, low electrical conductivity, magnetic properties etc. It is also possible to use a Lexan plastic as carrier material.

Accordingly, the doping material can, for example, be either diamagnetic (magnetic susceptibility<0) or paramagnetic (magnetic susceptibility>0). For example, the doping material can be selected from a first group of diamagnetic materials comprising the elements: graphite, bismuth. However, it is also possible for the doping material to be selected from a second group of paramagnetic materials comprising the elements: platinum, chromium, tungsten, ferritin. In particular, materials with a comparatively high absolute value for magnetic susceptibility can be used so that a local deviation of the magnetic field from the value of the basic magnetic field in the magnetic resonance system is particularly high. Accordingly, the local dephasing of the nuclear spins can be very different so that the value of the T2* relaxation time can be particularly low. It is also possible for the doping material to be palladium or to comprise carbon nanotubes.

For example, the material can have a macroscopic magnetic susceptibility which is substantially equal to the susceptibility of water or tissue or organic material or air. In this case, macroscopic susceptibility can, for example, designate the susceptibility value measured in the borderline case of large pieces of the material, that is with macroscopic dimensions. For a piece of this kind, an averaged intermixing of the carrier material and the doping material or a plurality of doping materials with different magnetic properties (diamagnetic/paramagnetic/ferromagnetic), can occur. For example, the piece can have dimensions which are equal to or larger than the volume. Values for the susceptibility of the above-named variables are known to the person skilled in the art and can, for example, be $\chi=9\cdot10^{-6}$ for water or tissue or $\chi=6\cdot10^{-6}$ for organic material or $\chi=0.38\cdot10^{-6}$ for air.

As explained above, the material according to the aspect currently under discussion can have the effect that fine intermixing of the carrier material with the doping material causes the susceptibility to vary locally. This can cause the T2* relaxation time to be particularly short and the material to have reduced visibility in MR imaging. If the material also has a macroscopic averaged susceptibility with one of the above values, in addition to this effect of reduced MR visibility, there is also the further effect of susceptibility matching: for example, susceptibility gradients can occur at the air-tissue interface, i.e. changes to susceptibility as a function of the location. For example, on the skin surface, the value of the magnetic susceptibility changes from $\chi=0.38\cdot10^{-6}$ to $\chi=9\cdot10^{-6}$. This can cause the local magnetic field-value in and around this area to deviate from the value of the basic magnetic field in the MR system. The MR imaging can then have so-called susceptibility artifacts in this area, for example shifts of the MR images etc.

If, however, the material has a suitably matched value, if the material is used, for example, for components of the MR system located close to the body, such as, for example, RF coils or shim pads, it can be achieved that no significant susceptibility gradients occur at the material-tissue interface. In other words, the susceptibility mismatch can be moved to areas which do not contribute to MR imaging. This can reduce the susceptibility artifacts in the MR images.

However, it is also possible for the material to have a susceptibility deviating from these above-named values for water or tissue or air or organic material. This can, for example, be advantageous in order to achieve particularly reduced MR visibility. In other words, optimization of the material properties with respect to the reduction of MR visibility can then take place—this primarily relates to the microscopic location-dependence of susceptibility, while macroscopic susceptibility can be of secondary importance.

It is, for example, in particular possible for the material to comprise a magnetic further doping material, which is admixed in a further proportion, wherein there can be homogeneous intermixing of the carrier material and the doping material and the further doping material within the volume and wherein a preceding sign of a susceptibility of the further doping material can be unequal to a preceding sign of a susceptibility of the doping material. Therefore, for example, the doping material can be paramagnetic and the further doping material diamagnetic (or vice versa). It is also possible for the doping material or the further doping material to be ferromagnetic.

In such a case, the effect of a particularly short T2* relaxation time can, for example, be achieved since the microscopic susceptibility gradients take on particularly high values or a number of different local magnetic field strengths occur within an MR imaging voxel. It can simultaneously be possible, by means of a selective choice of the proportion and the further proportion, to match the value of the macroscopic susceptibility of the material suitably as a function of the susceptibilities of the doping materials.

Generally, N doping materials can be mixed into the carrier material (susceptibility $\chi_B$) wherein they each have a susceptibility $\chi_n$. Then, the macroscopic susceptibility amounts to:

$$\chi_m = \chi_B V_B + \sum_{i=1}^{N} V_{Dn} \chi_n, \qquad (1)$$

where $V_B$, $V_{Dn}$ are the respective volume proportions of the carrier material or the doping materials. Therefore, the following applies:

$$V_B + \sum_{i=1}^{N} V_{Dn} = 1. \qquad (2)$$

For example, according to Equation 1, the following is obtained for two doping materials, namely graphite powder $\chi_{D1}=-205\cdot10^{-6}$ and palladium powder $\chi_{D2}=-806\cdot10^{-6}$, which are each mixed at $V_{D1}=5.20\%$ or $V_{D2}=0.20\%$ into a non-magnetic $\chi_B=0$ carrier material: $\chi_m=-9\cdot10^{-6}$. This corresponds to a value for human tissue. Here, the carrier material can, for example, be ABS GP22.

It would, for example, also be possible to mix $V_{D1}=5\%$ graphite or $V_{D2}=0.50\%$ $V_{D2}=0.50\%$ or $V_{D2}=1.00\%$ palladium into this carrier material resulting in macroscopic susceptibilities of -6.6 ppm or -2.6 ppm respectively.

The above examples are purely illustrative. Generally, the proportion and the further proportion can be different so that a macroscopic susceptibility is equal to a certain value. In particular, the admixing of a doping material and a further doping material can, for example, achieve a macroscopic susceptibility of the material equal to the value of water, air, tissue or organic material. In particular, it is also possible for the particle size of the further doping material to be, for example, smaller than 200 μm or in particular smaller than 10 μm. Generally, it is possible for corresponding requirements or the same requirements to be placed on the further doping material as those explained above with respect to the doping material.

A further aspect relates to a method for the production of a material for use in a magnetic resonance system, wherein the method comprises: melting a carrier material made of plastic by means of an extruder and admixing a proportion of a magnetic doping material such that a homogeneous intermixing is present within a volume of smaller than 1 mm². A method of this kind can be used in order to obtain a material for use in a magnetic resonance system according to the further aspect.

A still further aspect relates to a magnetic resonance system with a sensitive range, wherein the magnetic resonance system is set up in order to acquire magnetic resonance data for imaging within the sensitive range, wherein the magnetic resonance system for imaging comprises components within the sensitive range. The magnetic resonance system is characterized by the fact that the components comprise a material for use in a magnetic resonance system according to an aspect discussed above. For example, the components can relate to radio-frequency coils, a table or a couch for introducing the patient into the MR system or shim pads. If a material according to the illustrated embodiments is used for the production of such components, these components can have reduced visibility in MR imaging. These components can also have magnetic susceptibility matched to the susceptibility of the environment so that susceptibility artifacts in MR imaging can be reduced.

Naturally, the features of the embodiments and aspects that are described in the preceding can be combined with one another. In particular, the features can be used not only in the described combinations but also in other combinations or taken separately without departing from the scope of the claimed invention.

BRIEF DESCRIPTION OF THE DRAWINGS

The above-described properties, features and advantages and the way in which these are achieved will be explained in a clearer and easier-to-understand way in connection with the following description of the exemplary embodiments, which are explained in more detail with reference to the drawings, wherein.

DETAILED DESCRIPTION OF INVENTION

Figure 1:
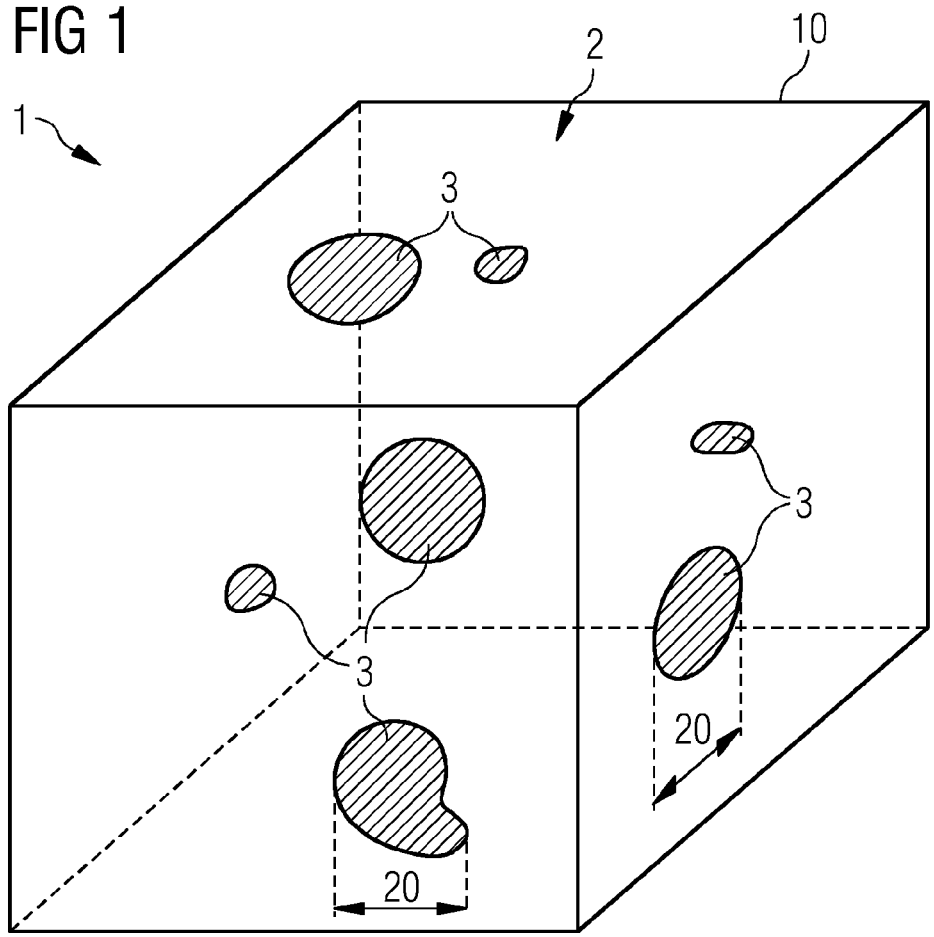
FIG. 1 shows a material with carrier material and admixed doping material.

The present invention is explained in more detail below with reference to example embodiments and with reference to the drawings. In the figures, the same reference characters designate the same or similar elements.

FIG. 1 shows a material 1, which is made up of a carrier material 2 and an admixed doping material 3. The doping material is depicted as embedded in particles or clusters in the carrier material 2. A particle size 20 is indicated.

Figure 2:
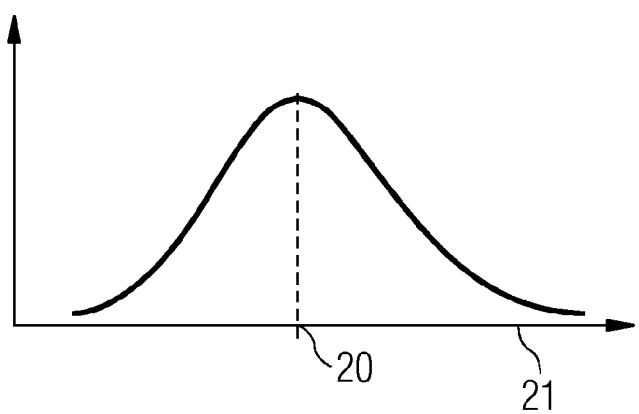
FIG. 2 shows a particle size distribution of the doping material.

FIG. 2 shows a particle size distribution 21, i.e. a frequency of different particle sizes, by way of example. The maximum of the particle size distribution 21 can, for example, be the particle size 20. In FIG. 2, the particle size distribution 21 is described by a Gaussian curve. For example, the particle size 20 can be smaller than 200 μm, in particular smaller than 100 μm, in particular smaller than 10 μm.

With reference once again to FIG. 1, it is evident that there are local deviations in the concentration of the doping material or the carrier material from a macroscopic mean value of concentrations. This is due to the particles or clusters of the doping material 3. Homogeneous intermixing, that is intermixing, with which the concentrations of carrier and doping material are equal to the macroscopic value in the borderline case of large volumes, is achieved for a volume 10 with a size of 1 mm³. In other words, the concentration of the participating materials 2, 3 varies microscopically with a characteristic length of approximately 1 mm. Averaging over greater lengths obtains values equal to the macroscopic mean value.

Such parameters are, for example, dependent on the production process. For example, pretreatment of the doping material can result in a smaller particle size and hence particularly homogeneous and fine intermixing. For example, the carrier material 2 can be a plastic, for example ABS GP22. The use of, for example, a twin-screw extruder to melt the plastic can enable particularly fine and homogeneous intermixing.

The doping material 3 is a magnetic material, i.e. it has a magnetic susceptibility unequal to 0. The doping material 3 can, for example, be ferromagnetic, diamagnetic or paramagnetic. The doping material 3 can in particular have a magnetic susceptibility different from the magnetic susceptibility of the carrier material 2. On the above-named characteristic length scale, i.e. within the volume 10, this causes susceptibility changes to occur, i.e. local fluctuations in the susceptibility. This means that, depending on the location within the volume 10, different susceptibility values are present. For example, the doping material 3 can be graphite or carbon nanotubes or bismuth or palladium or platinum or chromium or tungsten or ferritin. It is possible for proportions of, for example, 5-15 percent by weight or percent by volume to be added.

For example, the material 1 can be used for components inside an MR system. There, there is typically a basic magnetic field for polarizing the nuclear spins. The locally different susceptibilities within the volume 10 cause the basic magnetic field 10 to vary within the volume 10. Therefore, nuclear spins dephase at different speeds at different locations within the volume 10. If the MR system for MR imaging integrates over the volume 10, the material 1 has reduced visibility since the T2* relaxation time is reduced. In particular, this can apply to so-called gradient-echo MR imaging sequences, such as are known to the person skilled in the art. Integration for MR imaging over the volume 10 (so-called voxels) can, for example, be caused by a limited spatial resolution of the MR system or be necessary due to limited sensitivity which requires the acquisition of correspondingly accumulated measured values to increase a signal-to-noise ratio.

It should be understood that, with a less homogeneous intermixing of the material 1, for example in particular intermixing of the material, which lies on a characteristic length scale which is greater than the spatial resolution of the MR system, the T2* relaxation time can be comparatively less reduced. Then, it is namely possible for there to be a lower variation of the magnetic field strength within the volume 10 so that no different dephasing conditions for the nuclear spins occur.

Figure 3:
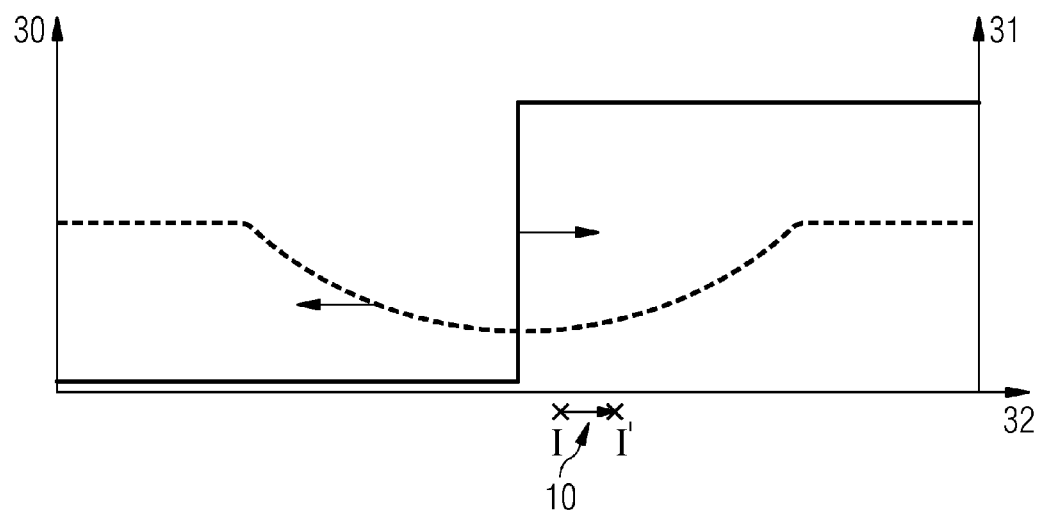
FIG. 3 shows a magnetic field variation on a first characteristic length scale due to a susceptibility mismatch.
Figure 4:
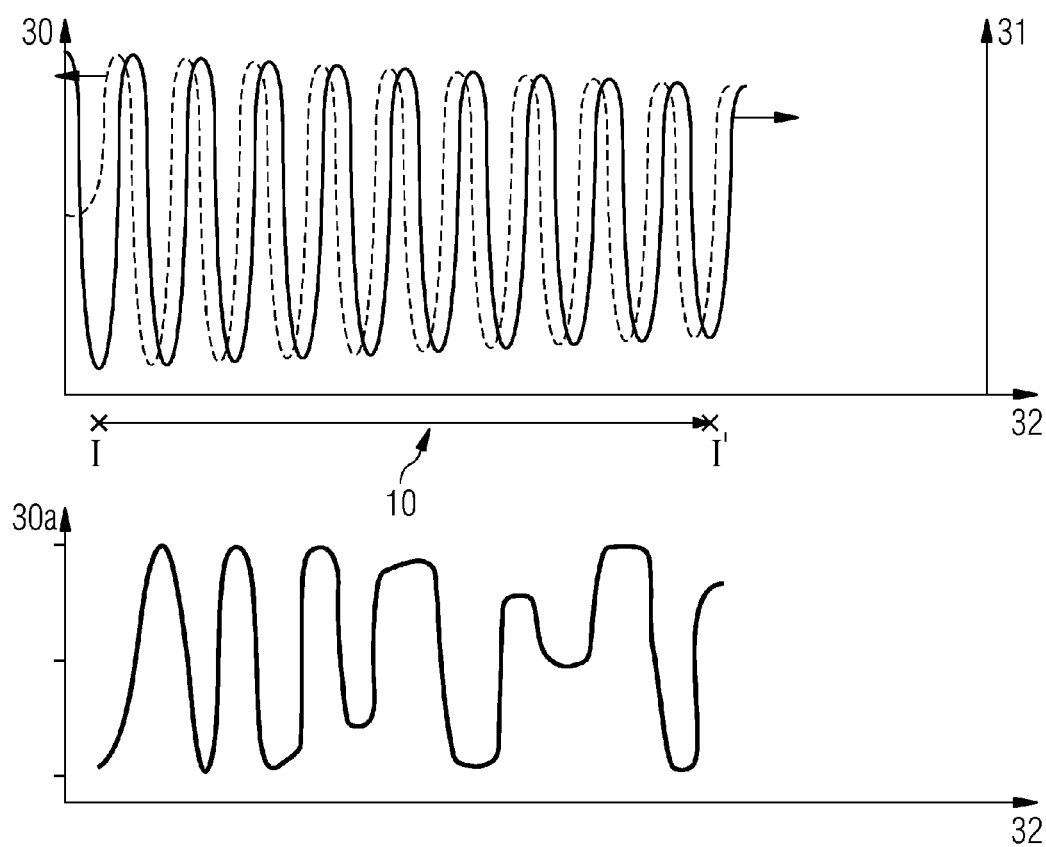
FIG. 4 shows a magnetic field variation on a second characteristic length scale due to microscopic susceptibility gradients, wherein the second characteristic length scale is shorter than the characteristic length scale in FIG. 3.

The different characteristic length scales mentioned are shown in FIGS. 3 and 4. FIG. 3 shows a value of the magnetic field 30 (dashed line, left scale) as a function of the location 32 for an abrupt jump in the local susceptibility 31 (continuous line, right scale). As FIG. 3 shows, in an area around the susceptibility jump, the value of the magnetic field 30 deviates from a constant value (for example the value of the basic magnetic field in the MR system). For example, the jump can occur at the transition from air to human tissue, that is on the surface of the skin.

A typical length scale in FIG. 3, i.e. a length scale on which the value of the magnetic field 30, is centimeters, approximately 5-10 cm. However, a voxel or a spatial resolution of a typical MR system is much smaller—in typical MR systems, a spatial resolution of 1 mm is achieved. A side length of the corresponding volume 10 is indicated for the length I-I'. However, on a length scale of this kind, in the scenario in FIG. 3, the magnetic field 30 does not vary at all or only varies slightly. Therefore, there would be a substantially homogeneous magnetic field in a voxel and no reduced visibility or only slightly reduced MR visibility would be achieved.

Correspondingly, at the top of FIG. 4, the value of the magnetic field 30 is shown as a function of the location 32 for a susceptibility 31 which varies on a substantially short length scale. The same lengths I-I' are indicated in both FIG. 3 and FIG. 4. A variation in susceptibility 31 of this kind as a function of the location 32 can, for example, be achieved for the material 1 according to an aspect if the intermixing of the carrier and doping material 2,3 within the volume 10, which is smaller than 1 mm$^3$, is homogeneous, i.e. the intermixing is particularly fine. For example, the length I-I' can designate a length of 1 mm. As shown in FIG. 4, the magnetic field 30 can then take on different values within a voxel of the MR imaging so that the T2* relaxation time of the material 1 is reduced, for example by a factor of 2 or 4 compared to the T2* relaxation time of the carrier material 2.

The bottom of FIG. 4 shows an orientation 30a of the magnetic field. Since the magnetization of the particle of the doping material 3, see FIG. 1, can generally have different orientations, the orientation 30a of the magnetic field can also vary on the characteristic length scale. This can also influence the T2* relaxation time.

Figure 5:
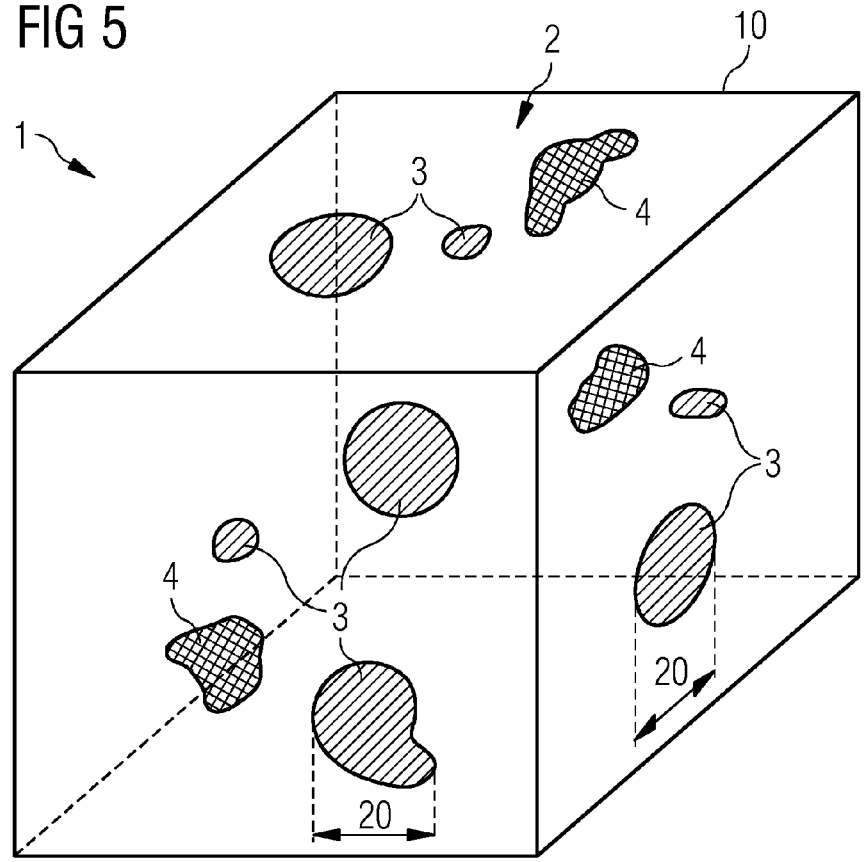
FIG. 5 shows a material with carrier material and admixed doping material and further doping material.

FIG. 5 shows the material 1, which comprises a further doping material 4 in addition to the doping material 3. The further doping material 4 can also be magnetic. In particular, the further doping material 4 can have a magnetic susceptibility, which has a different preceding sign than the magnetic susceptibility of the doping material 3. In other words, the doping material 3 can, for example, be paramagnetic or ferromagnetic (diamagnetic) while the further doping material 4 is diamagnetic (paramagnetic or ferromagnetic).

The use of the material 1 can cause two effects: firstly, the location-dependency of the susceptibility within the volume 10 can be particularly strong. This can cause the local magnetic field to fluctuate particularly strongly so that the T2* relaxation time of the nuclear spins can be particularly strongly reduced. The material 1 can also have reduced visibility in MR imaging. Secondly, it may be achieved by a suitable choice of the proportions of the doping materials 3, 4 on the basis of their susceptibilities that the macroscopic susceptibility of the material 1 is equal to a predetermined value, for example equal to air, water, tissue or organic material. This is described by the above equations 1 and 2. This can enable the reduction of susceptibility artifacts in MR imaging. Susceptibility artifacts can occur as a result of local deviations of the magnetic field strength 30, as illustrated in FIG. 3. However, it should be understood that the length scales decisive for these two effects have different orders of magnitude, as explained above with respect to FIGS. 3 and 4.

Figure 6:
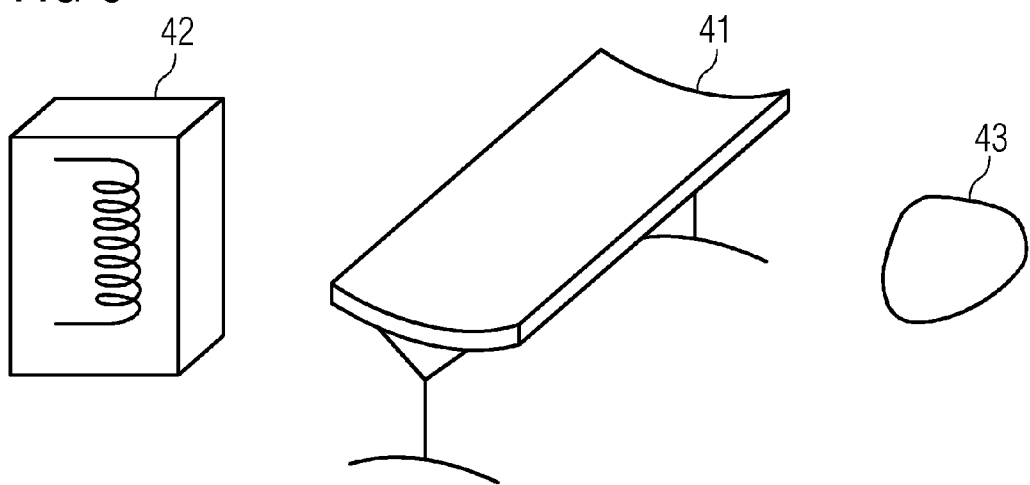
FIG. 6 illustrates components of an MR system.

FIG. 6 illustrates, by way of example, components 41, 42, 43, which can be partially or predominantly made of the material 1. This shows a table or couch 41 on which a patient can be introduced into the MR system. It also shows a local RF coil 42, which can be used to acquire MR signals or to excite the magnetization by the irradiation of RF pulses. It also shows a shim pad 43. The shim pads 43 have a specific susceptibility, approximately the susceptibility of human tissue. If the shim pad is close to the human body during the MR imaging, a jump in susceptibility, such as that illustrated in FIG. 3, occurs at locations, which are not part of the MR imaging (for example at the air-shim pad interface). This can cause a reduction in susceptibility artifacts, for example, close to the skin.

Therefore, doping of the MR imaging carrier material 2 with magnetic or weakly magnetic doping materials 3, 4, embodied, for example, as micro or nanoparticles, can achieve a reduction in the MR visibility of the material 1. This in particular allows common materials, such as, for example, conventional plastics, also to be used in imaging volumes of the MR system. This enables costs to be saved and new mechanical functions to be implemented, for example more flexible coils, coils with plastic joints, lighter patient tables etc., and patient comfort can be improved. Particularly suitable as carrier materials 2 are, in particular, thermoplastics, thermoplastic elastomers, elastomers, thermosets and foams. Suitable doping materials 3 are diamagnetic materials, in particular strongly diamagnetic materials, such as graphite and bismuth, and the whole range of paramagnetic materials. The doping material 3 or the further doping material 4 can be added in a range of 1-80 percent by weight, in particular in a range of 5-15 percent by weight, in particular in a range of 9-11 percent by weight. The particle size can be, for example, 100 μm, in particular less than 10 μm. In particular in the case of nanoparticles with particle sizes of less than 100 nm, it is also possible to use ferromagnetic materials.

Twin-screw extruders can advantageously be used for the preparation of the mixture of the carrier material 2 with the doping materials 3, 4, since this can achieve a particularly fine and homogeneous distribution by mixing the materials 2, 3, 4.

While specific embodiments have been described in detail, those with ordinary skill in the art will appreciate that various modifications and alternative to those details could be developed in light of the overall teachings of the disclosure. For example, elements described in association with different embodiments may be combined. Accordingly, the particular arrangements disclosed are meant to be illustrative only and should not be construed as limiting the scope of the claims or disclosure, which are to be given the full breadth of the appended claims, and any and all equivalents thereof. It should be noted that the term "comprising" does not exclude other elements or steps and the use of articles "a" or "an" does not exclude a plurality.

The invention claimed is:

1. A material for use in a magnetic resonance system, the material comprising:
   a carrier materials; and
   a magnetic doping material which is admixed in a specific proportion with the carrier material for producing the material for use in the magnetic resonance system, wherein a volume of the material which is smaller than 1 mm$^3$ contains a substantially homogeneous intermixing of the carrier material and the doping material, and wherein the material has a T2* relaxation time of nuclear spins in the volume which is reduced by a factor of at least 2 compared to a corresponding T2* relaxation time of the carrier material.

2. The material as claimed in claim 1, wherein a particle size of the doping material is smaller than approximately 200 μm.

3. The material as claimed in claim 2, wherein the particle size of the doping material is smaller than approximately 10 μm.

4. The material as claimed in claim 1, wherein the doping material comprises magnetic nanoparticles and wherein a particle size of the doping material is smaller than approximately 1 μm.

5. The material as claimed in claim 4, wherein the particle size of the doping material is smaller than approximately 100 nm.

6. The material as claimed in claim 4, wherein the magnetic nanoparticles are ferromagnetic.

7. The material as claimed in claim 1, wherein the proportion of the magnetic doping material admixed in the carrier material is in the range of 0.1%-80% by weight or volume.

8. The material as claimed in claim 7, wherein the proportion of the magnetic doping material admixed in the carrier material is in the range of 1%-20% by weight or volume.

9. The material as claimed in claim 1, wherein the carrier material is an acrylonitrile butadiene styrene (ABS) plastic.

10. The material as claimed in claim 1, wherein the carrier material is selected from the group consisting of: thermoplastics, thermoplastic elastomers, elastomers, thermosets, foams.

11. The material as claimed in claim 1, wherein the doping material is selected from a first group of diamagnetic materials consisting of the elements: graphite, bismuth; or from a second group of paramagnetic materials consisting of the elements: platinum, chromium, tungsten, ferritin.

12. The material as claimed in claim 1, wherein the material has a macroscopic magnetic susceptibility which is substantially equal to a susceptibility of water or tissue or organic material or air.

13. The material as claimed in claim 1, wherein the material has a macroscopic magnetic susceptibility which is unequal to at least a susceptibility of water and tissue and organic material and air.

14. The material as claimed in claim 1, wherein the factor is 4.

15. The material as claimed in claim 1, wherein the material comprises a magnetic further doping material which is admixed in a further proportion, wherein the volume contains a homogeneous intermixing of the carrier material and the doping material and the further doping material and wherein a preceding sign of a susceptibility of the further doping material is unequal to a preceding sign of a susceptibility of the doping material.

16. The material as claimed in claim 15, wherein a particle size of the further doping material is smaller than 100 μm.

17. The material as claimed in claim 15, wherein the proportion and the further proportion are different so that a macroscopic susceptibility is equal to a specific value.

18. A method for producing a material for use in a magnetic resonance system, the method comprising:

melting a carrier material made of plastic via an extruder, and admixing a proportion of a magnetic doping material with the carrier material for producing the material for use in the magnetic resonance system, wherein a volume of the material which is smaller than 1 mm$^3$ contains a homogeneous intermixing of the carrier material with the doping material, and wherein the material has a T2* relaxation time of nuclear spins in the volume which is reduced by a factor of at least 2 compared to a corresponding T2* relaxation time of the carrier material.

19. A magnetic resonance system with a sensitive range, wherein the magnetic resonance system is set up in order to obtain magnetic resonance data for imaging within the sensitive range, wherein the magnetic resonance system comprises:

components for imaging within the sensitive range, wherein the components comprise a material comprising a carrier material and a magnetic doping material which is admixed in a proportion with the carrier material, wherein a volume of the material which is smaller than 1 mm$^3$ contains a homogeneous intermixing of the carrier material and the doping material, and wherein the material has a T2* relaxation time of nuclear spins in the volume which is reduced by a factor of at least 2 compared to a corresponding T2* relaxation time of the carrier material.

* * * * *